United States Patent
Tan et al.

(10) Patent No.: US 7,173,461 B2
(45) Date of Patent: Feb. 6, 2007

(54) SELF-BIASED PHASED-LOCKED LOOP

(75) Inventors: Swee Boon Tan, Penang (MY); Keng L. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/140,684

(22) Filed: May 31, 2005

(65) Prior Publication Data

US 2006/0267646 A1 Nov. 30, 2006

(51) Int. Cl.
*H03L 7/06* (2006.01)
(52) U.S. Cl. ........................ 327/157; 327/148
(58) Field of Classification Search .............. None
See application file for complete search history.

(56) References Cited

U.S. PATENT DOCUMENTS

| | | | | |
|---|---|---|---|---|
| 5,727,037 A | * | 3/1998 | Maneatis | 375/376 |
| 5,877,907 A | * | 3/1999 | Tanishima et al. | 360/30 |
| 6,556,088 B1 | * | 4/2003 | Dietl et al. | 331/17 |
| 6,646,512 B2 | | 11/2003 | Abassi et al. | |
| 6,693,496 B1 | * | 2/2004 | Lebouleux | 331/185 |
| 6,710,670 B2 | | 3/2004 | Maneatis | |
| 6,753,740 B2 | * | 6/2004 | Gauthier et al. | 331/185 |
| 6,812,758 B2 | * | 11/2004 | Gauthier et al. | 327/158 |
| 6,859,108 B2 | * | 2/2005 | Abbasi et al. | 331/17 |
| 6,873,214 B2 | * | 3/2005 | Harwood | 331/17 |
| 6,894,569 B2 | * | 5/2005 | Fayneh et al. | 331/16 |
| 6,914,490 B2 | * | 7/2005 | Fayneh et al. | 331/16 |
| 6,922,047 B2 | * | 7/2005 | Knoll et al. | 324/76.53 |
| 6,937,075 B2 | * | 8/2005 | Lim et al. | 327/157 |
| 6,946,917 B2 | * | 9/2005 | Raha | 331/16 |

OTHER PUBLICATIONS

Maneatis, John G., "FA 8.1: Low-Jitter and Process-Independent DLL and PLL Based on Self Biased Techniques", *1996 IEEE International Solid-State Conference*, (1996), 3 pages.
Maneatis, John G., "Hidden Complexities of PLLs are Revealed", *Feature Article in Jan. 2002 Issue of ISD Magazine*, (Jan. 2002), 5 pages.
Maneatis, John G., "Low-Jitter Process-Independent DLL and PII Based on Self-Biased Techniques", *IEEE Journal of Solid-State Circuits*, vol. 31, No. 11, (Nov. 1996), 1723-1732.
Maneatis, John G., "Self-Biased High-Bandwidth Low-Jitter 1-to-4096 Multiplier Clock Generator PLL", *IEEE Journal of SOlid-State Circuits*, vol. 38, No. 11, (Nov. 2003), 1795-1803.
Maneatis, John G., "Self-Biased High-Bandwidth Low-Jitter 1-to-4096 Multiplier Clock Generator PLL", 688-690.

* cited by examiner

*Primary Examiner*—Timothy P. Callahan
*Assistant Examiner*—Cassandra Cox
(74) *Attorney, Agent, or Firm*—Ryder IP Law, PC; Douglas J. Ryder

(57) ABSTRACT

In general, in one aspect, the disclosure describes a phase-locked loop circuit. The circuit includes an oscillator having a first control input and a second control input, wherein the first control input and the second control input act to control output frequency of the oscillator. The circuit further includes a first charge pump and a second charge pump. A first bias generator is coupled to the first control input of the oscillator and can receive electrical input from the first charge pump and the second charge pump. A second bias generator is coupled to the second control input of the oscillator and can receive electrical input from the second charge pump and the first bias generator.

28 Claims, 5 Drawing Sheets

SELF-BIASED PHASED-LOCKED LOOP

BACKGROUND

The phase-locked loop (PLL) is a versatile electronic circuit used in a wide variety of applications, including frequency synthesis, clock recovery, clock multiplication, and clock regeneration. In large, high-speed integrated circuits (including application-specific integrated circuits, field-programmable gate arrays, network processors, and general purpose microprocessors), PLLs have become commonplace. On-chip phase-locked loop clock multipliers are used on these chips to generate a high-frequency clock signal that is a multiple of, and in phase with, a system clock or I/O clock. PLLs may also be used on these chips to resynchronize and realign clocks in deep clock distribution trees to reduce clock skew.

FIG. 1 illustrates an example block diagram of a PLL 100. The PLL 100 includes a phase-frequency detector (PFD) 110, a charge pump (CP) 120, a filter (e.g., low pass filter (LPF)) 130, and an oscillator 140. The output frequency of the oscillator 140 is controlled by one or more input control signals. In operation, the PLL 100 adjusts the oscillator 140 to match (in both frequency and phase) a reference input 160. The PLL 100 may also include a divider 150 on a feedback loop from the oscillator 140 to the PFD 110. The divider 150 takes PLL output 165 and divides it by N so that the divided signal 170 is compared to the reference input. This enables the PLL output 165 to be N times higher in frequency than the reference input 160, allowing the PLL 100 to perform frequency multiplication.

A self-biased PLL (SBPLL) is used to create on-chip PLLs that have low jitter and are relatively insensitive to integrated circuit process variations, supply voltage and operating temperature (PVT). However, a major weakness of the SBPLL is that the oscillator output is subject to amplitude variability and common mode disturbances during dynamic operation of the PLL (e.g., acquisition, locking). In particular, operational correction can lead to the front-end oscillator amplifier and the following amplifying stages (the so-called "post-oscillator amplifiers") being biased out of their optimal range (sweet spot), causing pulse evaporation (truncation, or dropped output clocks) and functional failure. This problem manifests as a non-monotonic montonic oscillator control surface (output frequency versus control inputs) which may lead to one or more of the following: long lock time or lock failure due to positive feedback, sensitivity to power supply noise, and functional sensitivity to large reference and/or feedback clock noise.

BRIEF DESCRIPTION OF THE DRAWINGS

The features and advantages of the various embodiments will become apparent from the following detailed description in which.

DETAILED DESCRIPTION

Figure 1:
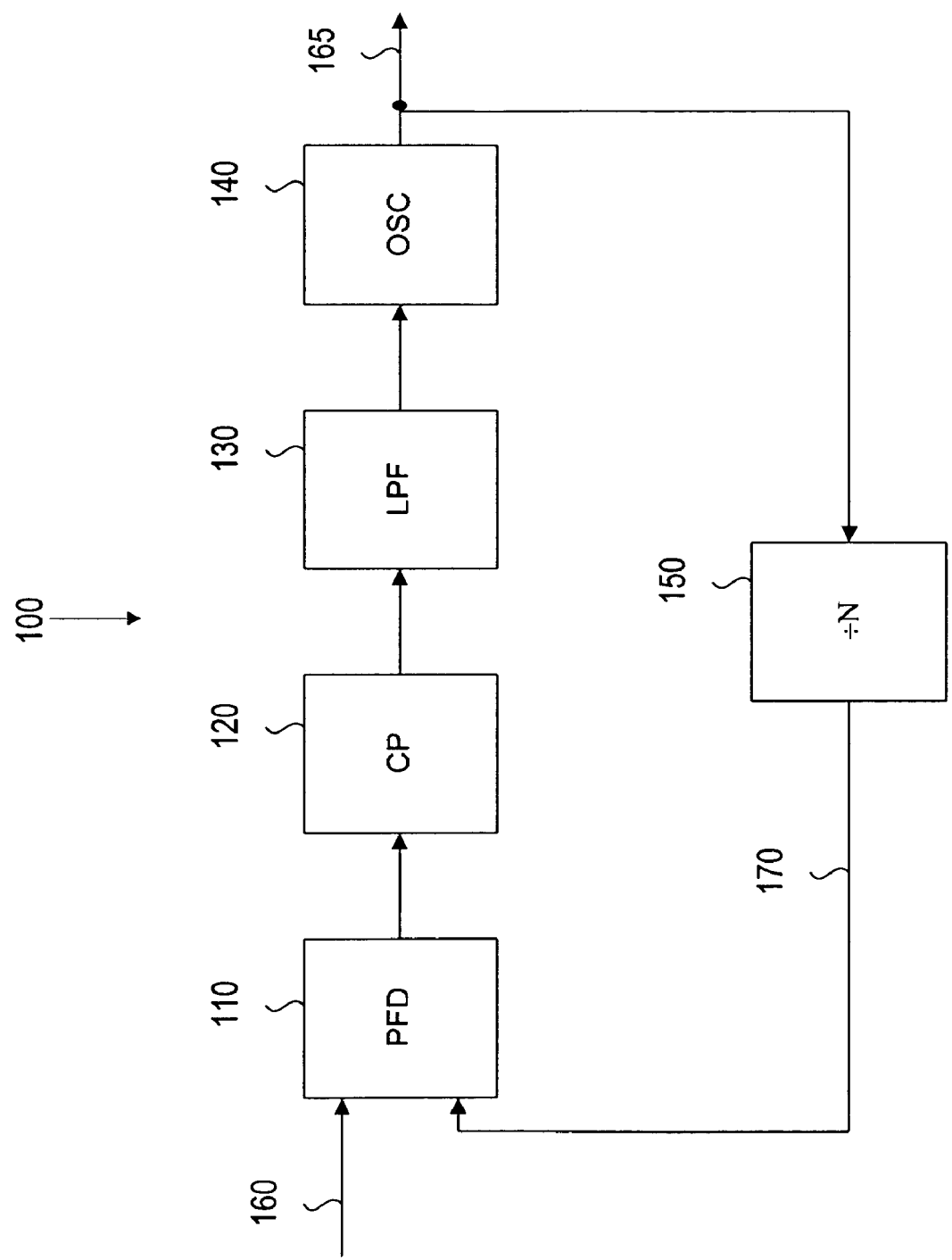
FIG. 1 illustrates an example phase-locked loop circuit, according to one embodiment.
Figure 2:
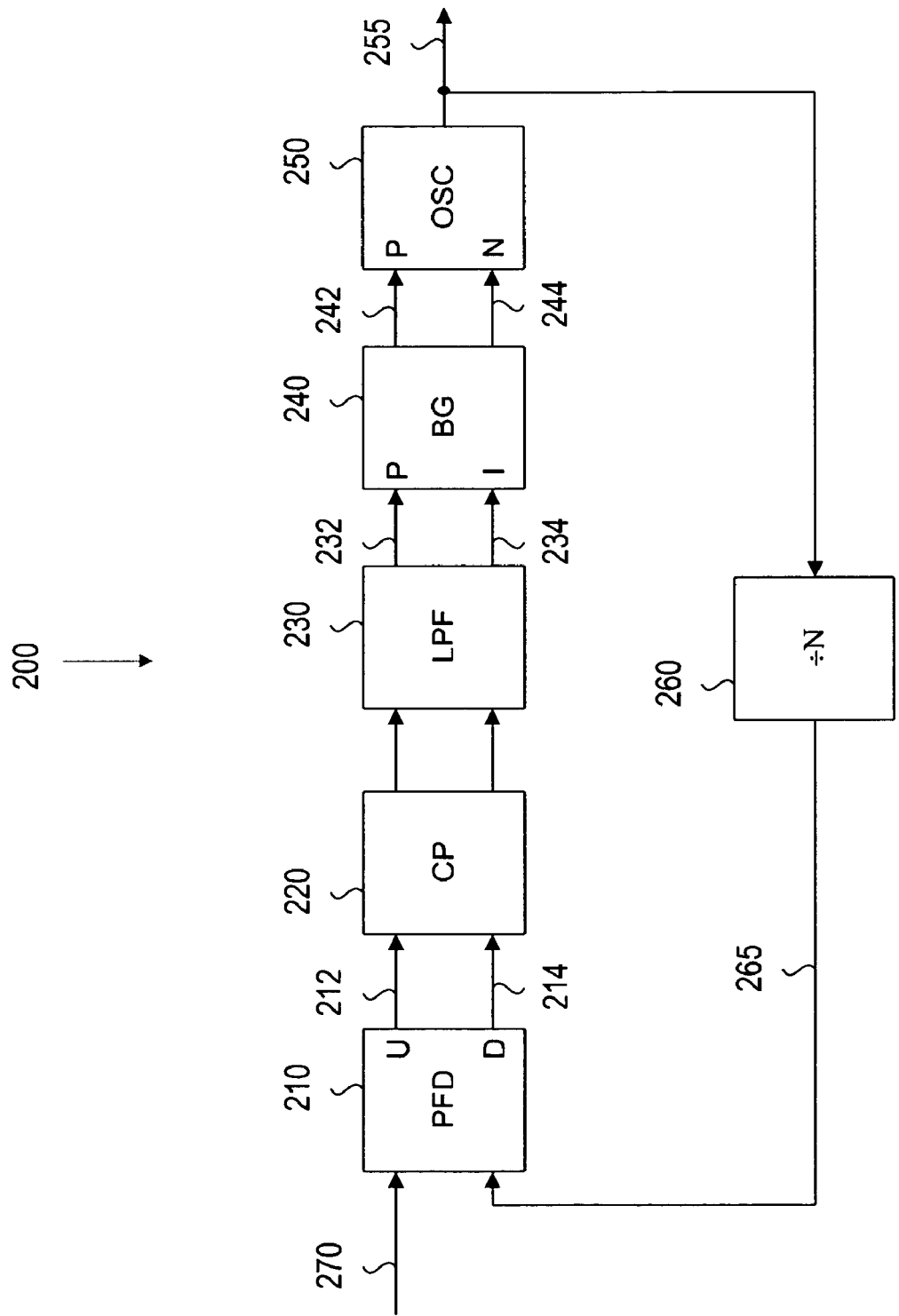
FIG. 2 illustrates an example self-biased phase-locked loop circuit, according to one embodiment.

FIG. 2 illustrates an example of an embodiment of a self-biased phase-locked loop (SBPLL) 200. The SBPLL 200 includes a phase-frequency detector (PFD) 210, a charge pump (CP) 220, a filter (e.g., LPF) 230, a bias generator (BG) 240, and an oscillator 250, and may include a divider 260. The output frequency of the oscillator 250 is controlled by one or more control inputs. In some embodiments, the oscillator 250 may be voltage controlled (voltage controlled oscillator (VCO)). In other embodiments, the oscillator 250 may be current controlled, or controlled by a combination of one or more current inputs and/or one or more voltage inputs.

The SBPLL 200 uses negative feedback to adjust the oscillator 250 such that the frequency of an oscillator output 255 or a divided oscillator output 265 matches (in both frequency and phase) a reference input 270. The PFD 210 compares the frequency and phase difference between the reference signal 270 and the oscillator/divided oscillator output 255/265 and generates one or more output signals based on this difference. As illustrated, the PFD 210 may generate an UP signal 212 or a DOWN signal 214. The PFD 210 generates UP signals 212 when the frequency (phase) of the oscillator/divided oscillator output 255/265 is lower than (lags) the reference signal 270. The PFD 210 generates DOWN signals 214 when the frequency (phase) of the oscillator/divided oscillator output 255/265 is higher than (leads) the reference signal 270. The UP and DOWN signals (charge pulses) 212, 214 generated are based on the amount of lag or lead respectively. The CP 220 and the LPF 230 smooth and condition the pulses from the PFD 210 and generate two control signals, a proportional control signal 232 and an integrating control signal 234.

The integrating control signal 234 represents the net accumulated (integrated) charge from the previously generated UP signals 212 and DOWN signals 214. The integrating control signal 234 also represents the dominant pole of the transfer function for the PLL 200. The proportional control signal 232 represents, more directly, the instantaneous UP signals 212 and DOWN signals 214. The proportional control 232 also represents the zero of the transfer function for the PLL 200. The proportional control signal 232 and the integrating control signal 234 are fed to the BG 240. The BG 240 processes these signals and generates control/bias signals, PBias 242 and NBias 244.

Figure 3A:
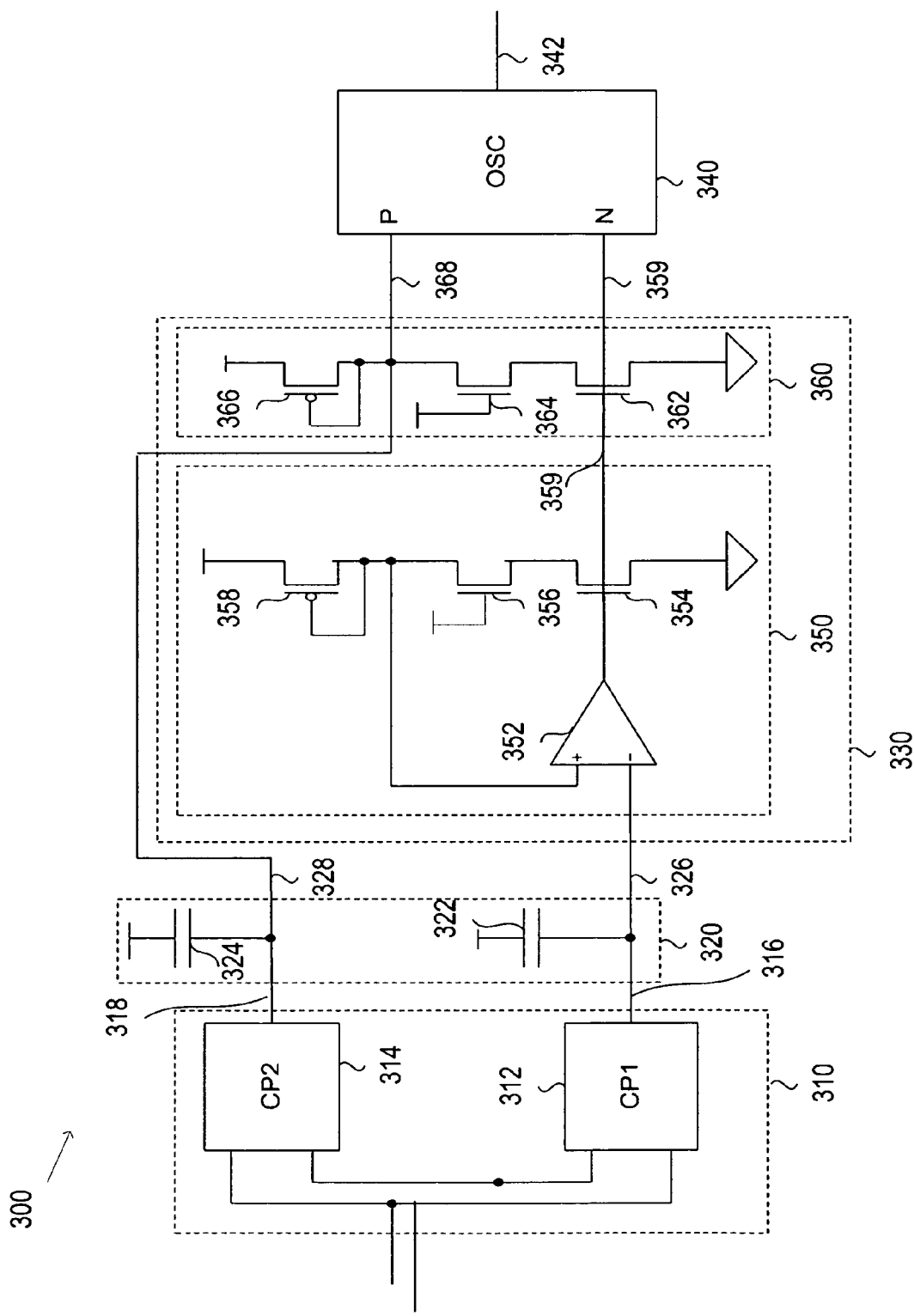
FIG. 3A illustrates example bias generators for a self-biased phase-locked loop circuit, according tone embodiment.

FIG. 3A illustrates a schematic of a portion of an example embodiment of a SBPLL 300. The SBPLL 300 includes a charge pump 310 (e.g., 220 of FIG. 2), a filter 320 (e.g., 230), a bias generator 330 (e.g., 240), and an oscillator 340 (e.g., 250). The charge pump 310 includes an integrating charge pump (CP1) 312 and a proportional charge pump (CP2) 314. The CP1 332 produces an integrating control signal 316 and the CP2 314 produces a proportional control signal 318. The filter 320 includes a capacitor 322 to filter the integrating control signal (filtered integrating control signal 326) and a capacitor 324 to filter the proportional control signal (filtered proportional control signal 328). The bias generator 330 includes an NBias generator 350 and a PBias generator 360. The NBias generator 350 includes an operational amplifier 352 and transistors 354, 356, and 358. According to one embodiment, the transistors 354 and 356 may be NMOS FETs and the transistor 358 may be a PMOS FET connected as a diode. The PBias generator 360 includes transistors 362, 364, and 366. According to one embodiment, the transistors 362 and 364 may be NMOS FETs and the transistor 366 may be a PMOS FET connected as a diode.

The integrating control signal 316 from CP1 312 passes through the filter 320 (drives capacitor 332). The filtered integrating control signal 326 is received by the Nbias generator 350 (as one input of the operational amplifier 352). An output 359 of the Nbias generator 350 is provided to the Pbias generator 360 (gate of transistor 362) and an "N" input of the oscillator 340. The proportional control signal 318 from the CP2 314 passes through the filter 320 (drives a capacitor 334). The filtered integrating control signal 328 is provided to the Pbias generator 360. An output 368 of the Pbias generator 360 is provided to a "P" input of the oscillator 340.

A portion of the filtered integrating control 326 signal is fed to the "P" input of the oscillator 340 via the NBias generator 350 and the Pbias generator 360 (transistors 362, 364). This provides some amount of biasing balance in the oscillator oscillatory signals. However, the filtered proportional control signal 328 is fed only to the "P" input of the oscillator 340. This tends to unbalance the oscillator bias during transitions in the proportional control. In fact, the oscillator 340 may act as a common mode amplifier to the "P" input, causing common mode shift and amplitude shrink in oscillator output 342, and stress to the post-oscillator path. Common mode shift and amplitude shrink in the oscillator output 343 manifests as a non-monotonic oscillator control surface (output frequency versus control inputs). A non-monotonic oscillator control surface may lead to one or more of the following: pulse evaporation (truncation, or dropped output clocks), long lock time or lock failure due to positive feedback, sensitivity to power supply noise, and functional sensitivity to large reference and/or feedback clock noise.

Figure 3B:
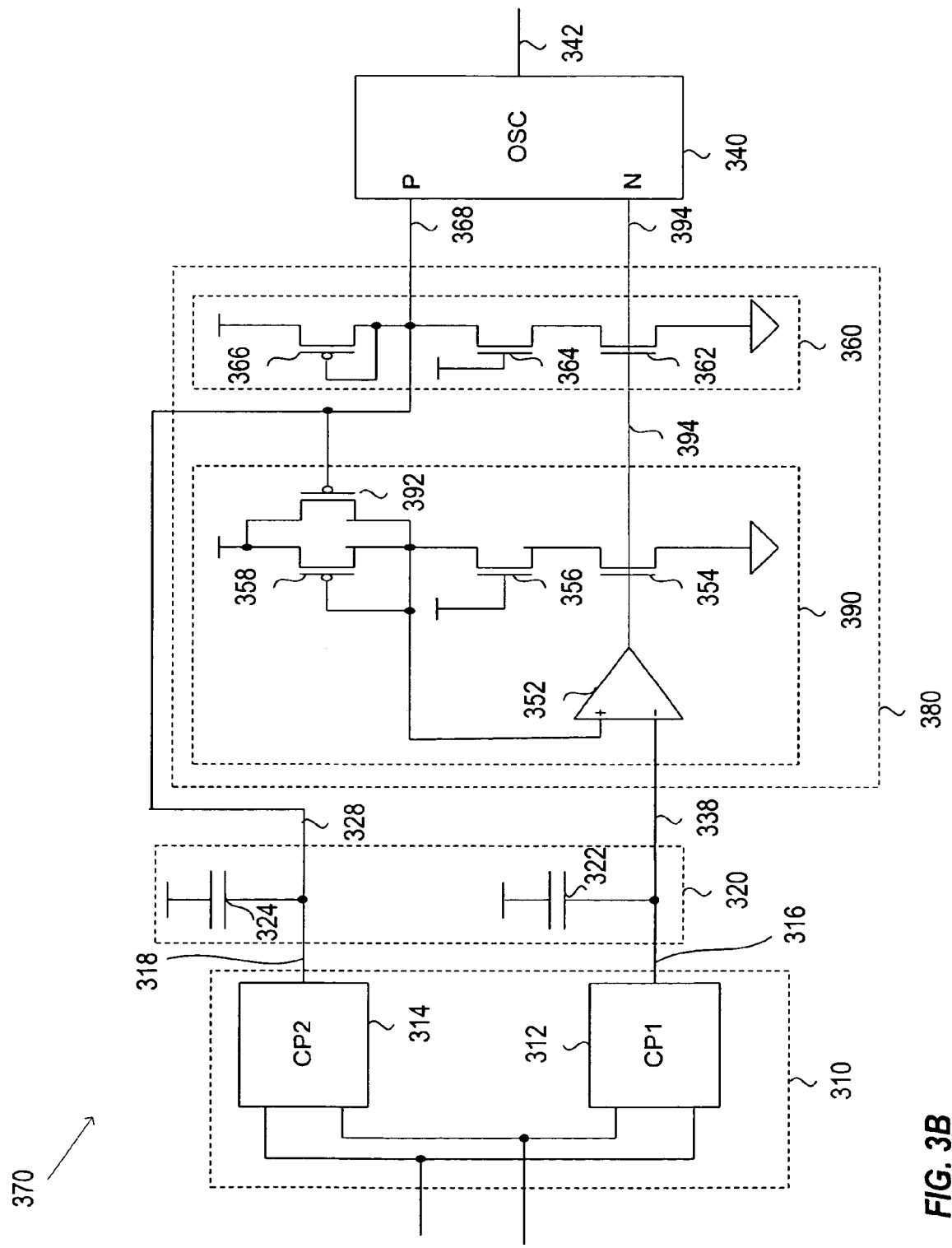
FIG. 3B illustrates example bias generators for a self-biased phase-locked loop circuit, according to one embodiment.

FIG. 3B illustrates a schematic of a portion of an example embodiment of a SBPLL 370 for reducing the oscillator common mode gain. The SBPLL 370 is similar to the SBPLL 300 of FIG. 3A in that it includes the charge pump 310, the filter 320, and the oscillator 340. The SBPLL 370 also includes a bias generator 380. The bias generator 380 includes an Nbias generator 390 and the Pbias generator 360 of FIG. 3A. The Nbias generator 390 includes the operational amplifier 352, and the transistors 354, 356, 358. The Nbias generator 390 also includes a transistor 392 (coupling transistor) in parallel to the transistor 358. The transistor 392 receives the filtered proportional control signal 328. Receiving the filtered proportional control signal 328 provides a modified feedback path from the CP2 314 to the N input of the oscillator 340. The modified feedback reduces the oscillator common mode gain.

The feedback path transfers a portion of the filtered proportional control signal 328 to the N input of the oscillator 340 via the Nbias generator 390 as output 394. The filtered proportional control signal 328 is added to the N input of the oscillator 340 in a direction, and with an amplitude, that minimizes the oscillator 340 signal attenuation to stabilize the common mode amplification. The portion of the filtered proportional control signal 328 coupled into the oscillator 340 via the NBias generator 390 may be determined by a ratio of the number of coupling transistors to the total number of coupling transistors and diode-connected transistors (acting as resistive elements). As illustrated in FIG. 3B, the portion of filtered proportional control 328 coupled into the NBias generator 390 is approximately 50% based on the use of one coupling transistor 392 and one diode-connected transistor 358 (1 coupling divided by total of 2 (1 coupling plus 1 diode)).

The feedback of output from the CP2 314 into the Nbias generator 390 stabilizes the behavior of the oscillator 340 during a perturbation in the phase-locked loop. During an event where the output of the CP2 334 drops to a lower voltage, the oscillator 340 increase in frequency is accompanied by stable output common mode with little attenuation.

Figure 4:
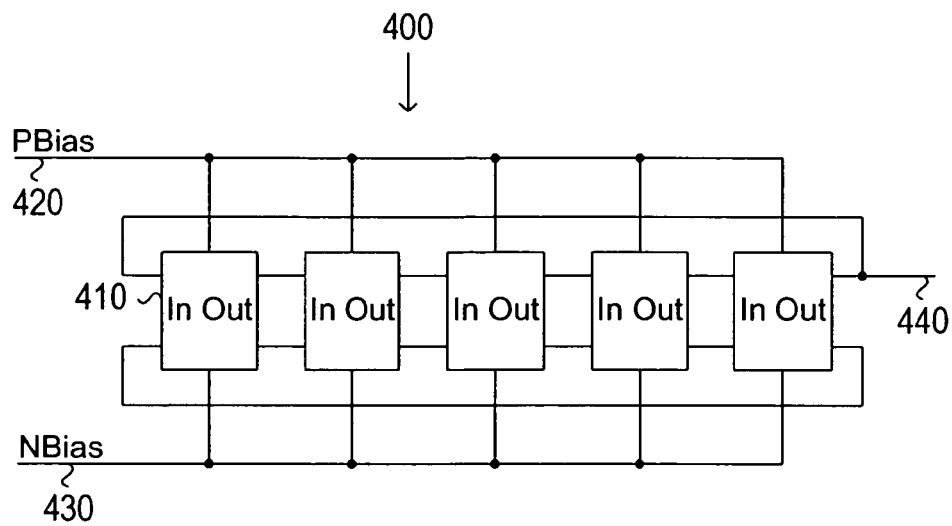
FIG. 4 illustrates an example of a multi-stage oscillator, according to one embodiment.

FIG. 4 illustrates an embodiment of an oscillator 400 (e.g., 340 of FIGS. 3A–B). The oscillator 400 includes a plurality of stages 410 (five stages are illustrated) organized as a ring oscillator. Each stage feeds its output to the input of the succeeding stage, with the output of the final stage feeding back to the input of the first stage. The oscillator receives a Pbias input 420 (e.g., 368 of FIGS. 3A–B) and an Nbias input 430 (e.g., 359 of FIG. 3A, 394 of FIG. 3B) and provides an output 440 (e.g., 342 of FIGS. 3A–B).

Figure 5:
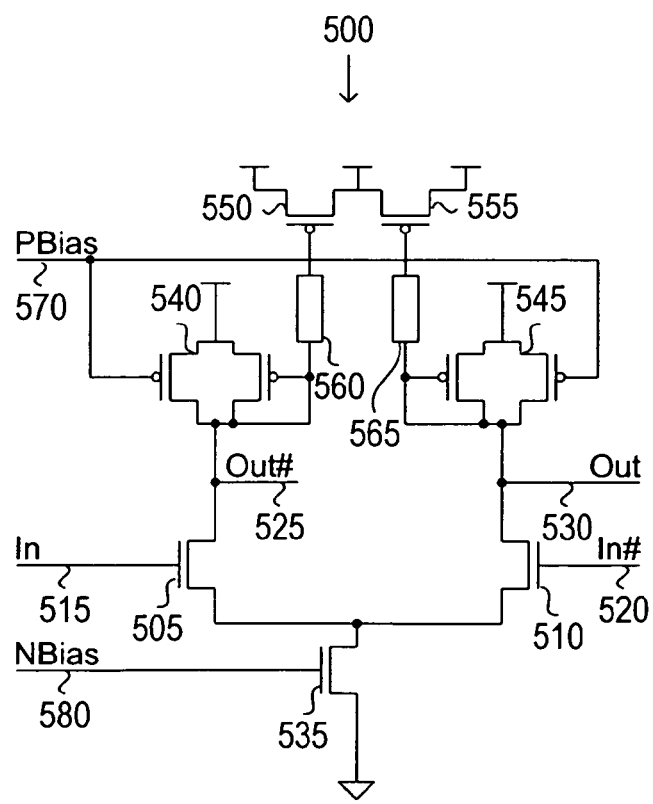
FIG. 5 illustrates an example of a stage of an oscillator, according to one embodiment.

FIG. 5 illustrates an embodiment of an oscillator stage 500 (e.g., 410 of FIG. 4). The oscillator stage 500 includes a differential pair of transistors 505, 510, a current source (current tail) transistor 535, transistor pairs 540 and 545 acting as voltage controlled resistors, transistors 550 and 555 acting as load capacitors, and transistors 560 and 565 acting as metal options to provide a means for adjusting, during device fabrication, the maximum frequency of the oscillator. A Pbias input 570 (e.g., 420 of FIG. 4) is provided to the transistor pairs 540 and 545. An Nbias input 580 (e.g., 430 of FIG. 4) is provided to the current source transistor 535. Differential inputs 515 and 520 from a previous oscillator stage are provided to the differential transistor pair 505, 510. Differential outputs 525 and 530 are provided to a next oscillator stage.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. A phase-locked loop circuit comprising:
   an oscillator having a first control input and a second control input, wherein the first control input and the second control input act to control output frequency of the oscillator;
   a first charge pump;
   a second charge pump;
   a first bias generator, coupled to the first control input of said oscillator, to receive electrical input from the first charge pump and the second charge pump; and a second bias generator, coupled to the second control input of said oscillator, to receive electrical input from said second charge pump and said first bias generator.

2. The circuit of claim 1, wherein the first charge pump generates an integrating control signal.

3. The circuit of claim 1, wherein the second charge pump generates a proportional control signal.

4. The circuit of claim 1, further comprising:
a first low-pass filter coupled between the first charge pump and the first bias generator; and
a second low-pass filter coupled between the second charge pump and the second bias generator.

5. The circuit of claim 1, wherein the oscillator comprises a plurality of stages.

6. The circuit of claim 1, wherein the first control input of the oscillator controls a current source of the oscillator.

7. The circuit of claim 1, wherein the second control input of the oscillator controls a variable resistance circuit of the oscillator.

8. The circuit of claim 1, wherein the first bias generator includes an amplifier and a plurality of transistors, wherein the amplifier receives input from the first charge pump and the plurality of transistors, and wherein the plurality of transistors receives input from the second charge pump and the amplifier.

9. The circuit of claim 1, wherein the first bias generator attenuates the signal from the second charge pump.

10. The circuit of claim 9, wherein the attenuation is based on number of coupling elements and number of resistive elements utilized.

11. The circuit of claim 9, wherein the attenuation is determined by a ratio of coupling elements to number of total coupling and resistive elements.

12. A phase-locked loop circuit comprising:
an oscillator having a first control input and a second control input, wherein the first control input and the second control input act to control output frequency of the oscillator;
a first charge pump;
a second charge pump;
a first bias generator coupled to the first control input of said oscillator, to receive electrical input from the first charge pump and the second charge pump, wherein the first bias generator includes
an amplifier having an inverting input, a non-inverting input and an output, wherein the inverting input of the amplifier receives the electrical input from the first charge pump;
a first transistor coupled to the output of the amplifier;
a second transistor coupled to the first transistor;
a third transistor coupled to the second transistor and the non-inverting input of the amplifier; and
a fourth transistor, connected in parallel with the third transistor, wherein the fourth transistor receives the electrical input from the second charge pump; and
a second bias generator, coupled to the second control input of said oscillator, to receive electrical input from said second charge pump and said first bias generator.

13. The circuit of claim 12, wherein the first and second transistors are NMOS FETs and the third and fourth transistors are PMOS FETs.

14. The circuit of claim 12, wherein the third transistor is connected as a diode.

15. The circuit of claim 12, wherein the third transistor and the fourth transistor cooperate to attenuate the electrical input received from the second charge pump.

16. A bias generator comprising:
an amplifier having an inverting input, a noninverting input and an output;
a first charge pump input coupled to the inverting input of the amplifier;
a first transistor coupled to the output of the amplifier;
a second transistor coupled to the first transistor;
at least one resistive element coupled to the second transistor and the noninverting input of the amplifier;
at least one coupling element, connected in parallel with the at least one resistive element; and
a second charge pump input coupled to the input to the at least one coupling element.

17. The bias generator of claim 16, wherein the first and second transistors are NMOS FETs.

18. The bias generator of claim 16, wherein the at least one resistive element and the at least one coupling element are PMOS FETs.

19. The bias generator of claim 16, wherein the at least one resistive element is a PMOS FET connected as a diode.

20. The bias generator of claim 16, wherein the at least one resistive element and the at least one coupling element cooperate to attenuate an electrical input received via the second charge pump input.

21. The bias generator of claim 16, wherein the attenuation is determined by a ratio of coupling elements to number of total coupling and resistive elements.

22. A method of stabilizing an oscillator in a phase-locked loop circuit, the method comprising:
applying an output of a first charge pump to a first input of a first bias generator;
applying an output of a second charge pump to a first input of a second bias generator;
applying a portion of the output of the second charge pump to a first input of a second bias generator;
applying an output of the first bias generator to a first input of an oscillator and to a second input of the second bias generator; and
applying an output of the second bias generator to a second input of the oscillator.

23. The method of claim 22, wherein the output of the second bias generator and the first input of the second bias generator are connected and the second bias generator provides a resistance that biases a voltage associated with the output of the second charge pump.

24. The method of claim 22, further comprising:
filtering the output of the first charge pump; and
filtering the output of the second charge pump.

25. The method of claim 22, wherein the portion of the output of the second charge pump applied to the second input of the first bias generator is based on attenuation provided by first bias generator.

26. A computer comprising:
a microprocessor die including:
an oscillator having a first control input and a second control input, wherein the first control input and the second control input act to control output frequency of the oscillator;
a first charge pump;
a second charge pump;
a first bias generator, coupled to the first control input of said oscillator, to receive electrical input from the first charge pump and the second charge pump; and a second bias generator, coupled to the second control input of said oscillator, to receive electrical input from said second charge pump and said first bias generator; and an off-die memory device.

27. The computer of claim 26, further comprising:

a first low-pass filter coupled between the first charge pump and the first bias generator; and a second low-pass filter coupled between the second charge pump and the second bias generator.

28. The computer of claim 26, wherein the first bias generator includes an amplifier having an inverting input, a non-inverting input and an output, wherein the inverting input of the amplifier receives the electrical input from the first charge pump;

a first transistor coupled to the output of the amplifier;

a second transistor coupled to the first transistor;

a third transistor coupled to the second transistor and the non-inverting input of the amplifier; and a fourth transistor, connected in parallel with the third transistor, wherein the fourth transistor receives the electrical input from the second charge pump.

\* \* \* \* \*